Oct. 27, 1970 R. L. HELTON 3,535,763

COMPONENT HANDLING TOOL FOR INSERTING DUAL-IN-LINE COMPONENTS INTO PRINTED CIRCUIT BOARDS

Filed March 3, 1969

INVENTOR.
ROY LEE HELTON

BY

Richard K. Macneill

United States Patent Office 3,535,763
Patented Oct. 27, 1970

3,535,763

COMPONENT HANDLING TOOL FOR INSERTING DUAL-IN-LINE COMPONENTS INTO PRINTED CIRCUIT BOARDS

Roy Lee Helton, 2941 Comstock St., San Diego, Calif. 92111

Filed Mar. 3, 1969, Ser. No. 812,523
Int. Cl. H05k *13/04*
U.S. Cl. 29—203 3 Claims

ABSTRACT OF THE DISCLOSURE

A component handling tool for inserting dual-in-line components into printed circuit boards having an elongated guide member with an axial bore therein slidably receiving a plunger; a handle portion on one end of the plunger for restraining the plunger in one direction and a component contact portion on the other end of said plunger for restraining the plunger in another direction and contacting a dual-in-line component; the contactor portion being slidably received in a rectangular head portion of said guide member; the head portion being dimensioned for snugly receiving a dual-in-line component therein.

BRIEF DESCRIPTION OF THE INVENTION

The present invention relates to a component handling tool and more particularly to a component handling tool for aligning the electrical leads of dual-in-line package components into printed circuit board sockets.

According to the invention, a component handling tool is provided having a guide member with an axial bore therein for slidably receiving a plunger. The plunger has a restraining portion on one end which serves as a handle and a component contacting portion on the other end which also serves as a restraining member. The contacting portion is slidably received by a head which is dimensioned for the snug reception of dual-in-line packaging components and which serves to align the leads for insertion into a printed circuit board socket, etc.

An object of the present invention is the provision of a component handling tool for handling dual-in-line package components.

Another object of the invention is the provision of an electronic component handling tool which automatically aligns the leads of dual-in-line package components into printed circuit board sockets.

A further object is the provision of an electronic component handling tool for picking up and dispensing dual-in-line package components.

Yet another object of the invention is the provision of an electronic component handling tool which is inexpensive to manufacture and assemble and extremely convenient in use.

Other objects and many of the attendant advantages of this invention will be readily appreciated as the same becomes better understood by reference to the following detailed description when considered in connection with the accompanying drawings in which like reference numerals designate like parts throughout the figures thereof and wherein.

DETAILED DESCRIPTION OF THE DRAWINGS

Figure 1:
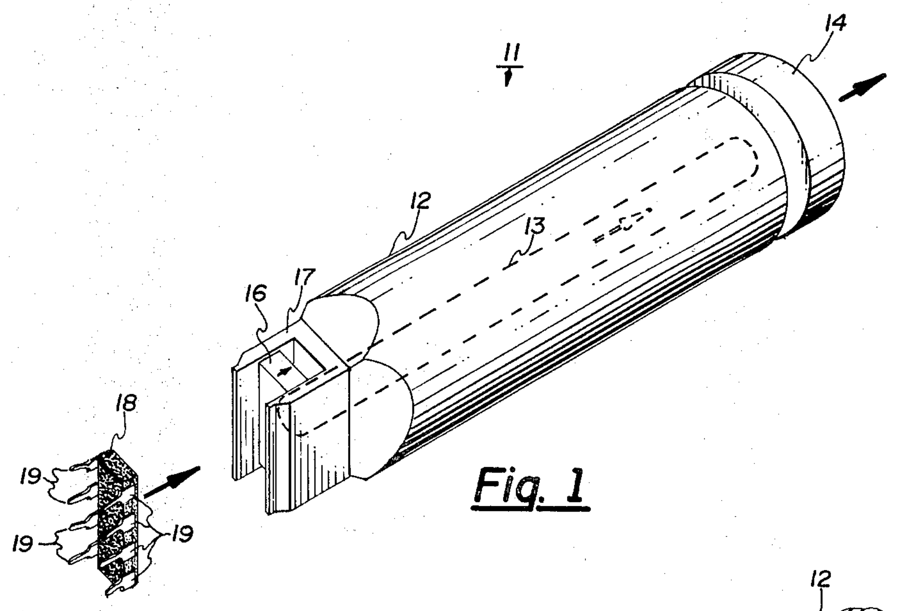
FIG. 1 is a perspective view of the preferred embodiment of the invention with a dual-in-line package component in spatial relationship thereto.

Referring to FIG. 1, an electronic component handling tool is shown generally at 11 having a guide member 12 with a plunger 13 slidably received therein. Plunger 13 has a restraining handle 14 fixedly attached on one end thereof and a component contacting portion 16 fixedly attached on another end thereof. Component contacting member 16 is slidably received by head portion 17. A dual-in-line package component 18 having dual-in-line leads 19 is shown in spatial relationship with head portion 17.

Referring to FIG. 2, guide member 12 is again shown having a head portion 17 fixedly attached on one end thereof with component contacting portion 16 received therein, as well as dual-in-line package component 18.

Referring to FIG. 3, guide member 12 is again shown having head portion 17 fixedly attached thereto with dual-in-line package component 18 being ejected by component contacting member 16 into socket holes 21 of printed circuit board 22.

Figures 2, 3:
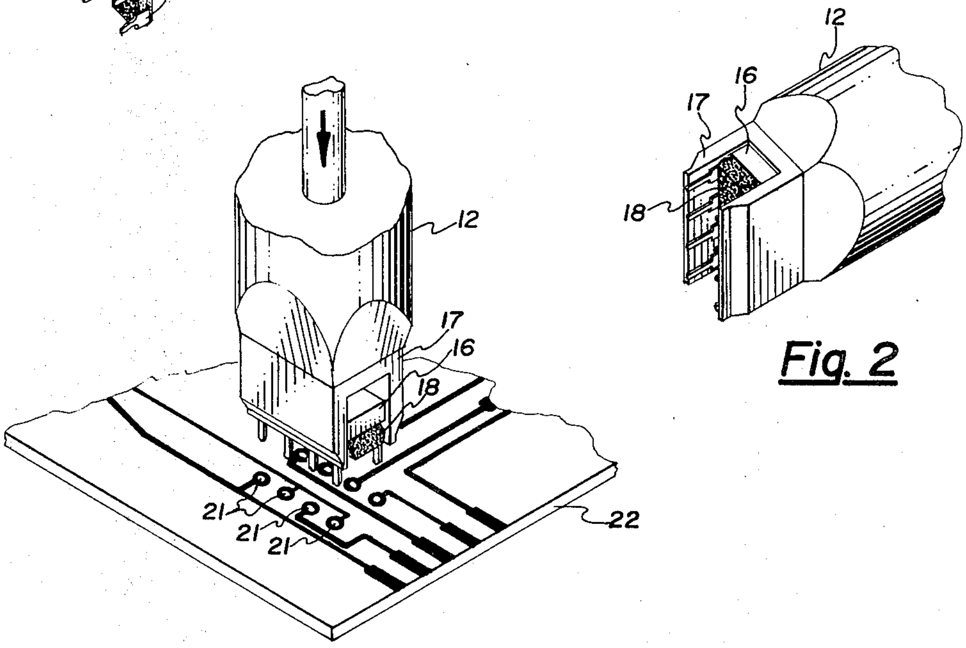
FIG. 2 is a portion of the embodiment of FIG. 1 with a dual-in-line package component inserted in the tool.
FIG. 3 is a perspective view of the portion illustrated in FIG. 2 shown in spatial relationship to a socket in a printed circuit board.

Referring now to all of the figures, by close inspection of the dual-in-line component 18, as shown in FIG. 1, it can be seen that the leads 19 are constructed of a spring metal and are not actually in line, but have a tendency to move in an outer direction from the body of the component. In order to insert these leads in a printed circuit board socket, for example, they must be pinched together and brought into vertical alignment. This is one of the major purposes of the component handling tool 11. By forcibly inserting dual-in-line component 18 into head portion 17, the inner walls of head portion 17 exert a pressure against the leads 19 forcing them into vertical alignment as shown in FIGS. 2 and 3. When the leads are then started in a printed circuit board socket, for example, as shown in FIG. 3, the plunger 13 is pushed by handle portion 14 which forces component contacting portion 16 against dual-in-line package component 18, ejecting the component into the socket.

Obviously, the tool is convenient for other handling of dual-in-line package components, but one of the primary purposes is that of vertically aligning the leads.

It should be understood, of course, that the foregoing disclosure relates to only a preferred embodiment of the invention and that it is intended to cover all changes and modifications of the example of the invention herein chosen for the purposes of the disclosure which do not constitute departures from the spirit and scope of the invention.

The invention claimed is:

1. A component handling tool for inserting dual-in-line components into printed circuit boards comprising:

an elongated guide member having an axial bore therein;

a plunger slidably received by said axial bore;

a component rectangular portion on one end of said plunger; and a U-shaped head portion fixedly attached to one end of said guide member and dimensioned for slidably receiving said contact portion of said plunger and snugly receiving a dual-in-line component.

2. The component handling tool of claim 1 wherein: said contact portion is dimensioned for restraining said plunger in one direction.

3. The component handling tool of claim 1 and further including:

a handle portion on another end of said plunger for restraining the plunger in one direction.

References Cited

UNITED STATES PATENTS

| | | | |
|---|---|---|---|
| 3,087,235 | 4/1963 | Porter | 29—206 |
| 3,210,836 | 10/1965 | Johanson et al. | 29—278 |
| 3,222,766 | 12/1965 | Camargo | 29—203 |
| 3,443,297 | 5/1969 | Lusby | 29—203 |

THOMAS H. EAGER, Primary Examiner

U.S. Cl. X.R.

29—206